United States Patent [19]

Carp et al.

[11] Patent Number: 4,604,983
[45] Date of Patent: Aug. 12, 1986

[54] ANALOG DUTY CYCLE TO BCD CONVERTER

[76] Inventors: Ralph W. Carp, 90 Huxley Pl., Newport News, Va. 23606; Robert E. Weber, 978 Lacon Dr., Newport News, Va. 23602; Danny O. Wright, 411 Dare Rd., Grafton, Va. 23692

[21] Appl. No.: 721,358

[22] Filed: Apr. 9, 1985

[51] Int. Cl.$^4$ ............................................. F02M 25/06
[52] U.S. Cl. ................................... 123/571; 361/154
[58] Field of Search ....................... 123/568, 569, 571; 361/152, 153, 154, 166; 251/129.09, 129.1

[56] References Cited

U.S. PATENT DOCUMENTS 4,347,544  8/1982  Ohba ..................................... 361/154
4,452,210  6/1984  Sasayama et al. ............... 361/154 X
4,453,379  6/1984  Kawamura et al. ............. 361/571 X
4,479,161  10/1984 Henrich et al. ..................... 361/154
4,528,968  7/1985  Otobe ................................... 123/571

Primary Examiner—Willis R. Wolfe, Jr.
Attorney, Agent, or Firm—Russel C. Wells; Markell Seitzman

[57] ABSTRACT

An analog duty cycle to BCD converter for receiving pulsed digital signals (10) from an electronic computing unit (11) for operating an electromagnetic operated exhaust gas recirculation valve (12) having a plurality of valve actuators each responding to a binary valued voltage signal. The converter receives pulsed electrical signals (10) and through a low pass active filter means (14) and a comparator means (18), generates binary weighted control signals (22) for operating power transistors in a power switch means (24), a threshold means (20) provides a plurality of threshold voltage signals to the comparator means (18) to generate the control signals (22).

6 Claims, 3 Drawing Figures

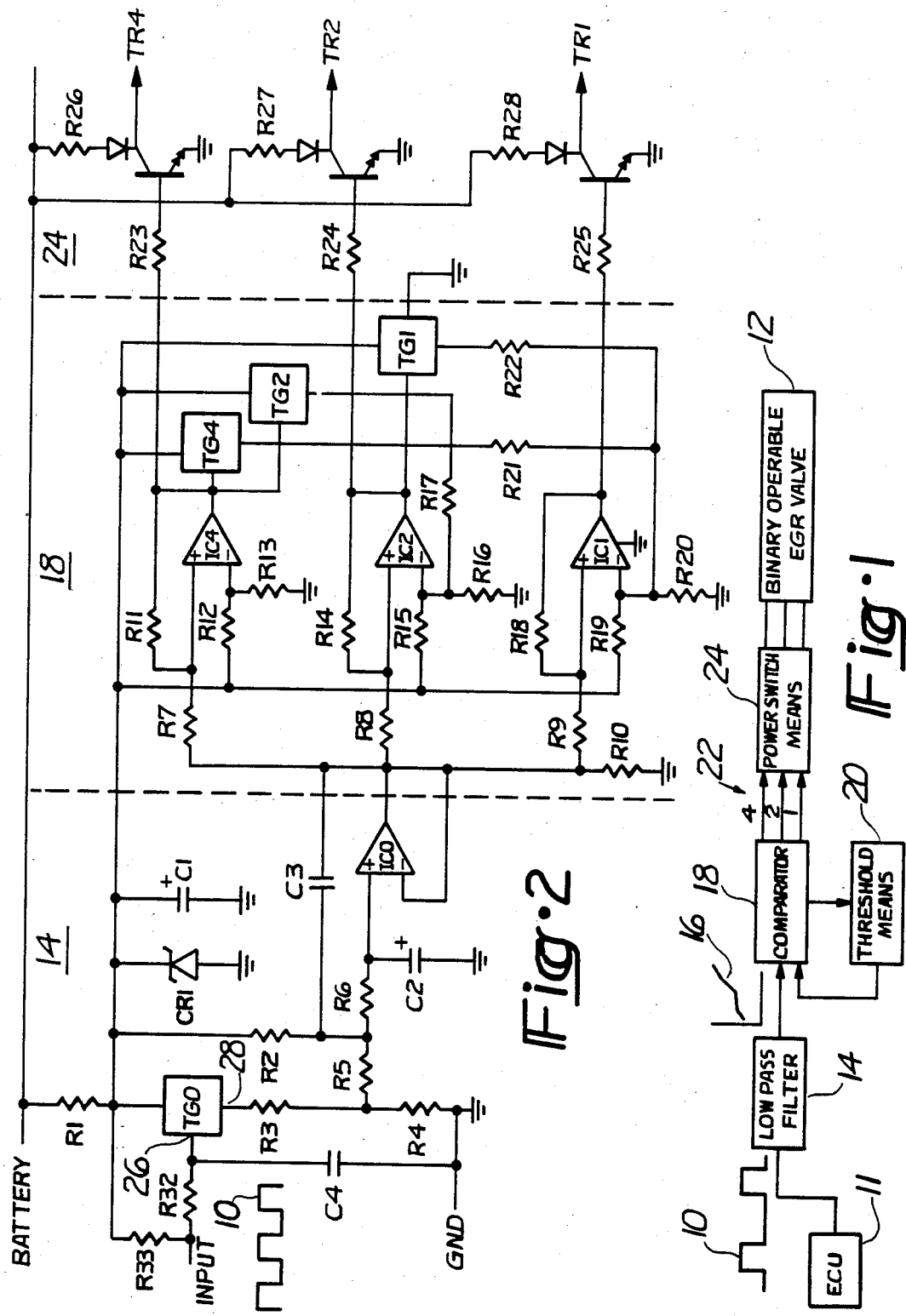

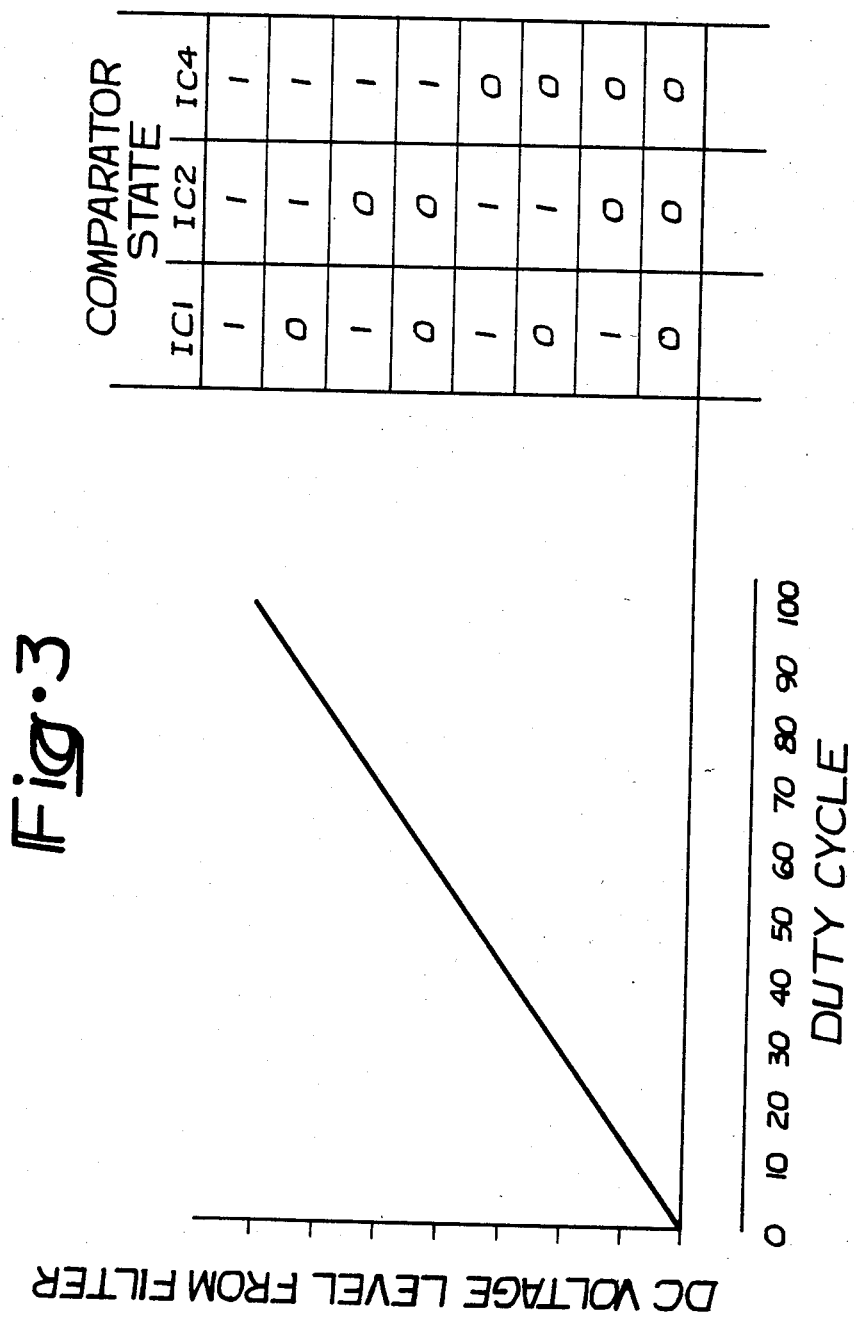

ANALOG DUTY CYCLE TO BCD CONVERTER

FIELD OF INVENTION

This invention relates to stepped bias comparator circuits in general and more particularly to an analog duty cycle to BCD converter for controlling electrically actuated exhaust gas recirculation valves.

BACKGROUND OF INVENTION

With the requirement for the use of Exhaust Gas Recirculation (EGR) for emission purposes in motor vehicles, the original valves were responsive to a temperature control to cause the valve to open fully when EGR was required. As more sophistication in motor vehicle control systems developed, the control of the EGR valve became more important and more refined. The electronic control unit or on-board computer in the vehicle responding to signals from various sensors, generated pulse width signals to modulate or cycle the EGR valve as required. However, the valve still had only one open and one close position.

A binary encoded and operable EGR valve having better control of the amount of gas recirculation by having a plurality of solenoid actuated valve ports is described in now abandoned U.S. patent application having Ser. No. 659,501 entitled "Electro-Mechanically Controlled EGR Valve and Method" and filed by John E. Cook on Oct. 10, 1984. The above application is a continuation of U.S. Ser. No. 536,475 filed on Sept. 28, 1983 now abandoned.

SUMMARY OF INVENTION

It is a principal advantage of the present invention to provide a control system for such a binary encoded and operable EGR valve. The advantage of such a system is to better control the mixture of exhaust gas into the combustion process of the engine. This is accomplished by an analog duty cycle to BCD converter circuit having a low pass active filter means for receiving a digitally encoded voltage signal and generating an analog voltage signal proportional thereto. A threshold means is provided for generating a plurality of voltages each representing a binary value. Both of the signals are supplied to a plurality of comparators, each having a binary representation. The comparators generate binary encoded analog signals proportional to the value of the digitally encoded voltage signals. The output of the comparators is supplied to power switch means controlling the application of power to the coils of the EGR valve.

DESCRIPTION OF DRAWINGS

These and other advantages will become apparent in the following drawings in which:

FIG. 1 is a block diagram of the circuit according to the present invention.

FIG. 2 is an electrical schematic of the circuit according to the present invention.

FIG. 3 is a graph of the active filter output on the ordinate to a chart showing the relationship thereto with the comparators.

DETAILED DESCRIPTION

FIG. 1 illustrates a block diagram of the preferred embodiment of the present invention of an analog duty cycle to BCD converter circuit. The circuit receives a digital signal 10 from a source such as an electronic control unit 11 and converts that signal to one or more actuation signals to control, among other things, a binary encoded exhaust gas recirculation (EGR) valve 12.

In the preferred embodiment, the signals are generated in an electronic control unit (ECU) 11 as may be found in the control system of a motor vehicle. The signals are generated in response to various sensors (not shown) indicating the requirement for actuating an EGR valve 12. An example of such an EGR valve 12 is found in now abandoned U.S. patent application having Ser. No. 659,501 which was filed on Oct. 10, 1984 entitled "Electro-Mechanically Controlled EGR Valve and Method" by John E. Cook. The above application is a continuation of the now abandoned U.S. Ser. No. 536,475 filed on Sept. 28, 1983. Both applications are expressly incorporated herein by reference.

The signals 10 from the ECU 11 are supplied to a two pole low pass active filter means 14 operating to convert the pulses 10 to an analog voltage level 16. The output voltage level from the filter means 14 is supplied to a plurality of comparator means 18. The comparator means 18 compares the filter output voltage level 16 with a plurality of threshold voltage levels from a threshold means 20 and as a result generates, in the preferred embodiment, binary encoded analog voltage levels 22 representing the amount of EGR to be applied to the engine. These levels 22 are coupled to three power switch means 24 for actuating the three solenoids in the EGR valve 12 according to the desired duty cycle of the EGR valve. The chart on FIG. 3 illustrates the binary values of the output voltage from the comparator means 18 in response to the output voltage from the low pass filter means 14 and further relates a possible duty cycle operation of the EGR valve 12.

Referring to FIG. 2 the input signal 10 from the ECU 11 is received at the control input 25 of the transmission gate TGO. The output 28 of the transmission gate TGO is electrically connected to the input of a two pole, low pass, active filter means 14. The input signal being a digital valued signal having a pulse repetition rate proportional to the value of the data from the ECU 11, controls the gate and connects a regulated voltage to the input of the active filter means 14.

The output of the active filter means 14 is supplied to the comparator means 18. As illustrated, in the preferred embodiment, the comparator means 18 comprises three comparators IC1, IC2, IC4. Each comparator receives the output voltage level of the low pass filter means 14 through a resistor R7, R8, R9, respectively at its noninverting input and has a threshold voltage level signal applied to its inverting input. Each comparator represents a binary valued signal which is one, two, and four respectively. Refer to the chart on FIG. 3. If the signal on the noninverting input is higher than the signal on the inverting input, the output of the comparator is high to represent a binary level.

The threshold means 20 comprises a network of transmission gates TG1, TG2, TG4 and resistors R17, R21, R22 wherein the transmission gates are controlled by the outputs from the comparators IC2, IC4. It is the function of the threshold means 20 to logically equate the voltage level from the filter means 14 output to the operation of the EGR valve 12.

The output of the first comparator IC1 or the binary one comparator is connected to one of the power switch means 24 which is a transistor TR1 through a base resistor R25. The threshold level for the binary one comparator IC1 is initially generated by the voltage divider R19 and R20. This level is typically very low and if the output voltage from the filter means 14 is greater, the output of the first comparator IC1 is high and the transistor TR1 is driven into conduction.

The threshold voltage to the second IC2 or binary two comparator, is generated from the voltage divider R15, R16. This voltage level is higher than the threshold voltage for the binary one comparator IC1. If the filter means 14 output voltage is higher than the threshold voltage at the inverting input, the output of the second comparator IC2 is a high signal turning on another of the power switch means 24 transistors TR2 through base resistor R24. Also connected to the output of the second comparator IC2 is a transmission gate TG1 which when operated will connect a resistor R22 in parallel with the voltage divider resistor R19 in the binary one comparator threshold voltage circuit. By parallelling the resistors, the effective threshold voltage level on the binary one comparator IC1 is increased to a value above the initial value of the binary two comparator IC2. This will cause the binary one comparator to respond to a decimal value of three.

If the voltage level from the output of the filter means 14 is greater than the new threshold voltage level on the binary one comparator IC1, the output will remain high and the power switch means transitor TR1 will remain in conduction. The feedback resistors R11, R14, R18 from the output of the comparators IC1, IC2, IC4 to the noninverting inputs of the comparators provide a hystersis means to keep the comparators from fluctuating as the threshold voltage levels are switching.

The initial threshold voltage level for the binary four comparator IC4 is generated by the voltage divider comprising R12 and R13. If the output voltage from the filter means 14 is greater than the threshold voltage on the inverting input, the output is high turning on, through the base resistor R23, the binary four transistor TR4 in the power switch means. As this is the highest binary value in the preferred embodiment, this comparator IC4 will remain high as long as the output voltage from the filter means 14 exceeds the initial threshold voltage level.

The output of the binary four comparator IC4 is electrically connected to two transmission gates TG2, TG4, one for each of the binary one and binary two comparators IC1, IC2. The transmission gates operate to raise the threshold voltage level on both the binary one and binary two comparators by placing parallel resistors R17, R21 in the voltage divider networks of the threshold means 20 thereby raising the threshold voltage level at the inverting inputs of the two comparators IC1, IC2 respectively.

When the binary four comparator IC4 has a high output level, the binary one transmission gate TG4 connected in the output circuit operates to connect a resistor R21 in parallel with the upper voltage divider resistor R19 in the binary one comparator IC1 threshold voltage circuit. In a similar manner the binary two transmission gate TG2 connected in the output circuit operates to connect a resistor R17 in parallel with the upper voltage divider resistor R15 in the binary two comparator IC2 threshold voltage circuit.

FIG. 3 is a graphic representation of the operation of the threshold means 20 illustrating the relationship between the low pass active filter output voltage 14 and a possible duty cycle percentage of the operation of the EGR valve 12. The chart correlates the value of the low pass active filter means 14 output voltage 16 and the actuation of the power switch means 24. In the application of the EGR valve 12, this duty cycle is an indication of how much exhaust gas is recirculated when the valve 12 is energized. If all three of the power switch means 24 transistors TR1, TR2, and TR4 are actuated, then the maximum amount of exhaust gas is recirculated to the input of the engine cylinders.

There has thus been shown and described an electronic circuit for interfacing a duty cycle modulated signal generated by a vehicle computer to the control coils of an EGR valve. The circuit converts a digital signal into binary encoded signals.

What is claimed is:

1. An analog duty cycle to BCD converter circuit for controlling a binary encoded EGR valve, the circuit comprising:
    low pass active filter means for receiving a digitally encoded voltage signal and generating an analog voltage signal proportional thereto;
    threshold means for generating a plurality of threshold voltages each representing a binary value;
    comparator means for receiving said analog voltage signal and said threshold voltages and generating binary encoded analog signals proportional to the digitally encoded voltage signal; and
    power switch means actuable in response to said binary encoded analog signals
    wherein said low pass filter means is a two pole active filter.

2. An analog duty cycle to BCD converter circuit for controlling a binary encoded EGR valve, the circuit comprising:
    low pass active filter means for receiving a digitally encoded voltage signal and generating an analog voltage signal proportional thereto;
    threshold means for generating a plurality of voltage signals of an initial level and for varying the level of said threshold voltages in accordance with the magnitude of said analog voltage signal, each representing a binary value;
    comparator means for receiving said analog voltage signal and said threshold voltages and generating binary encoded analog signals proportional to the digitally encoded voltage signal; and
    power switch means actuable in response to said binary encoded analog signals
    wherein said comparator means comprises at least two comparators each representing a binary value and each receiving said analog signal on one input and a corresponding one of said threshold voltages on another input, the output of each of said comparators being supplied to said power switch means.

3. An analog duty cycle to BCD converter circuit according to claim 2 wherein each of said comparators represents a different binary value and additionally includes transmission gate means operatively connected to each of said comparators for modifying the threshold voltage for said comparator corresponding to the smaller of said binary values.

4. An analog duty cycle to BCD converter circuit for controlling a binary encoded EGR valve, the circuit comprising:
    low pass active filter means for receiving a digitally encoded voltage signal and generating an analog voltage signal proportional thereto;

threshold means for generating a plurality of threshold voltages each representing a binary value;

comparator means for receiving said analog voltage signal and said threshold voltages and generating binary encoded analog signals proportional to the digitally encoded voltage signal; and power switch means actuable in response to said binary encoded analog signals wherein said threshold means includes transmission gate means responding to the magnitude of the analog voltage signal for modifying at least one of said threshold voltages.

5. An analog duty cycle to BCD converter circuit according to claim 4 wherein said comparator means comprises three comparators respectively representing binary encoded values.

6. An analog duty cycle to BCD converter circuit according to claim 4 wherein said comparator means additionally includes hystersis means for smoothing the binary encoded analog signals supplied to the power switch means.

* * * * *